United States Patent
White

[11] 4,132,981
[45] Jan. 2, 1979

[54] SELF-POWERED SYSTEM FOR MEASURING AND STORING CONSUMPTION OF UTILITY METER

[75] Inventor: Raymond V. White, Monroeville, Pa.

[73] Assignee: Rockwell International Corporation, Pittsburgh, Pa.

[21] Appl. No.: 734,678

[22] Filed: Oct. 21, 1976

[51] Int. Cl.² .............................................. G08C 19/16
[52] U.S. Cl. .................................... 340/203; 340/151; 340/150
[58] Field of Search ......................... 340/203, 151, 150

[56] References Cited
U.S. PATENT DOCUMENTS

| | | | |
|---|---|---|---|
| 3,571,800 | 3/1971 | Taylor | 340/150 |
| 3,618,023 | 11/1971 | Parker | 340/203 X |
| 3,897,887 | 8/1975 | Goldberg | 340/151 X |
| 4,004,097 | 1/1977 | Spaulding | 340/150 X |

*Primary Examiner*—Harold I. Pitts
*Attorney, Agent, or Firm*—R. Lewis Gable; Albert G. Marriott

[57] ABSTRACT

A system is disclosed for storing signals indicative of a customer's consumption of a utility as measured by a meter, such as adapted to measure the flow of water, gas or electricity, for example, and for storing a corresponding data word to permit subsequent readout from the system of utility consumed and of a data word identifying the customer consuming the service, whereby the utility company providing the service may appropriately and accurately prepare a bill for the customer. This system comprises a meter or pulse generator responsive to the input from the utility company to the customer to provide a signal typically in the form of a pulse-like, electrical signal indicative of the consumption of a given quantity of the utility, a storage or memory means for storing a first data word indicative of the utility consumed and a second data word specifying the customer, and sequence control means for permitting interrogation of the memory means, whereby the data words indicative of utility consumed and the customer identification may be read out, typically by an external interrogation unit. The interrogation unit may typically comprise a portable unit including a storage mechanism such as a cassette, carried by a "meter reader" to each customer location. This system is self-powered, requiring only the application of either of a pulse-like, electrical signal of the utility meter or an interrogate signal from the interrogation unit for its complete energization, and operates in a first, pulse increment mode of operation to respond to the application of the meter signal and in particular the sensing of a particular voltage level of the meter signal to increment the currently-stored data word indicative of the previously-stored utility consumption, store the new incremented data word and thereafter deactuate the system. In a second, interrogation mode of operation, an interrogation signal from the interrogation unit actuates and energizes the system when the voltage level of the interrogation signal rises above a predetermined level, whereby the system reads from the system's memory the stored data word indicative of the utility consumption and the customer's identification, which both are applied to the interrogation unit, and thereafter the system is deactuated.

39 Claims, 24 Drawing Figures

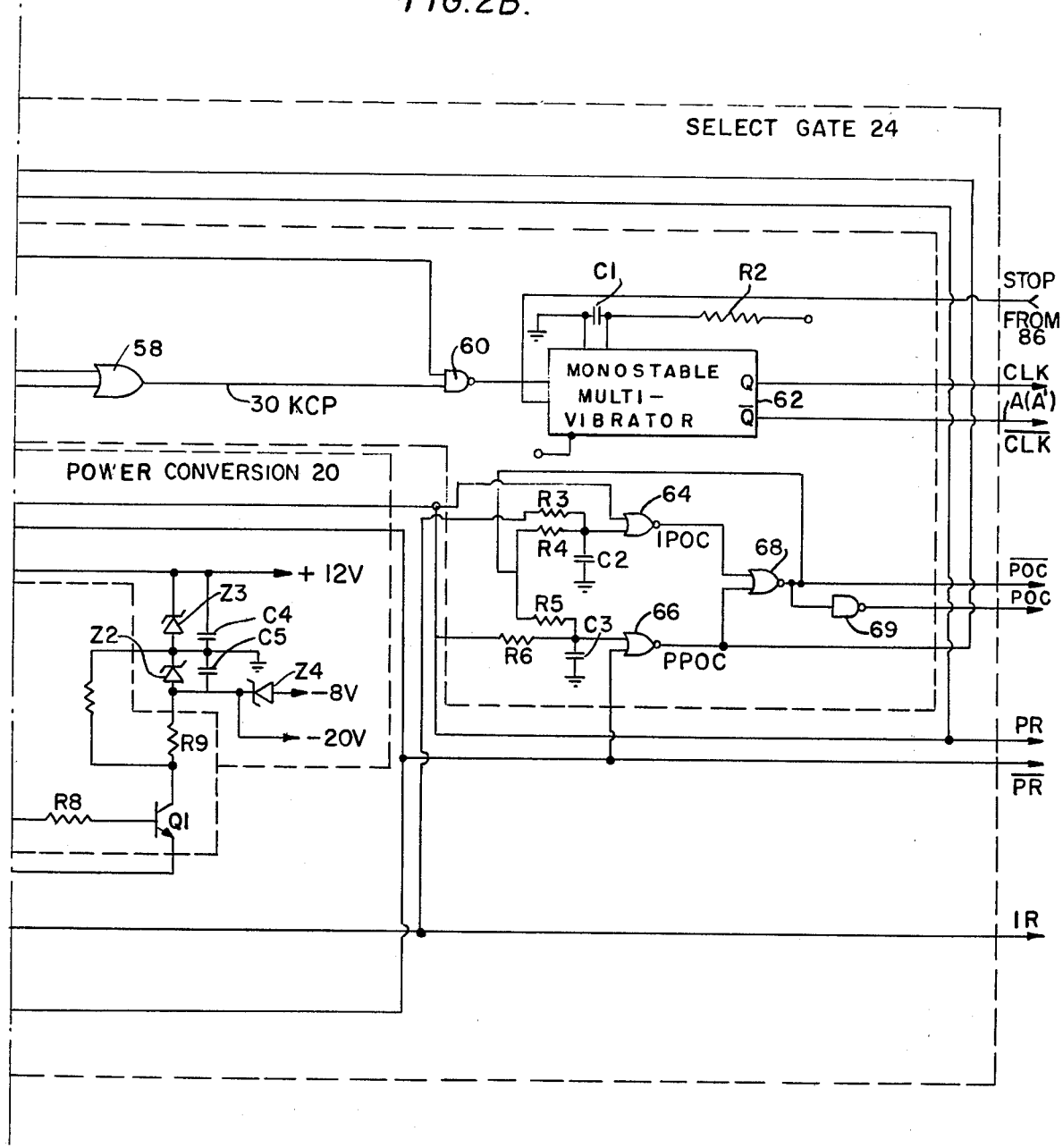

IR SEQUENCER LOGIC
AND MEMORY SELECT

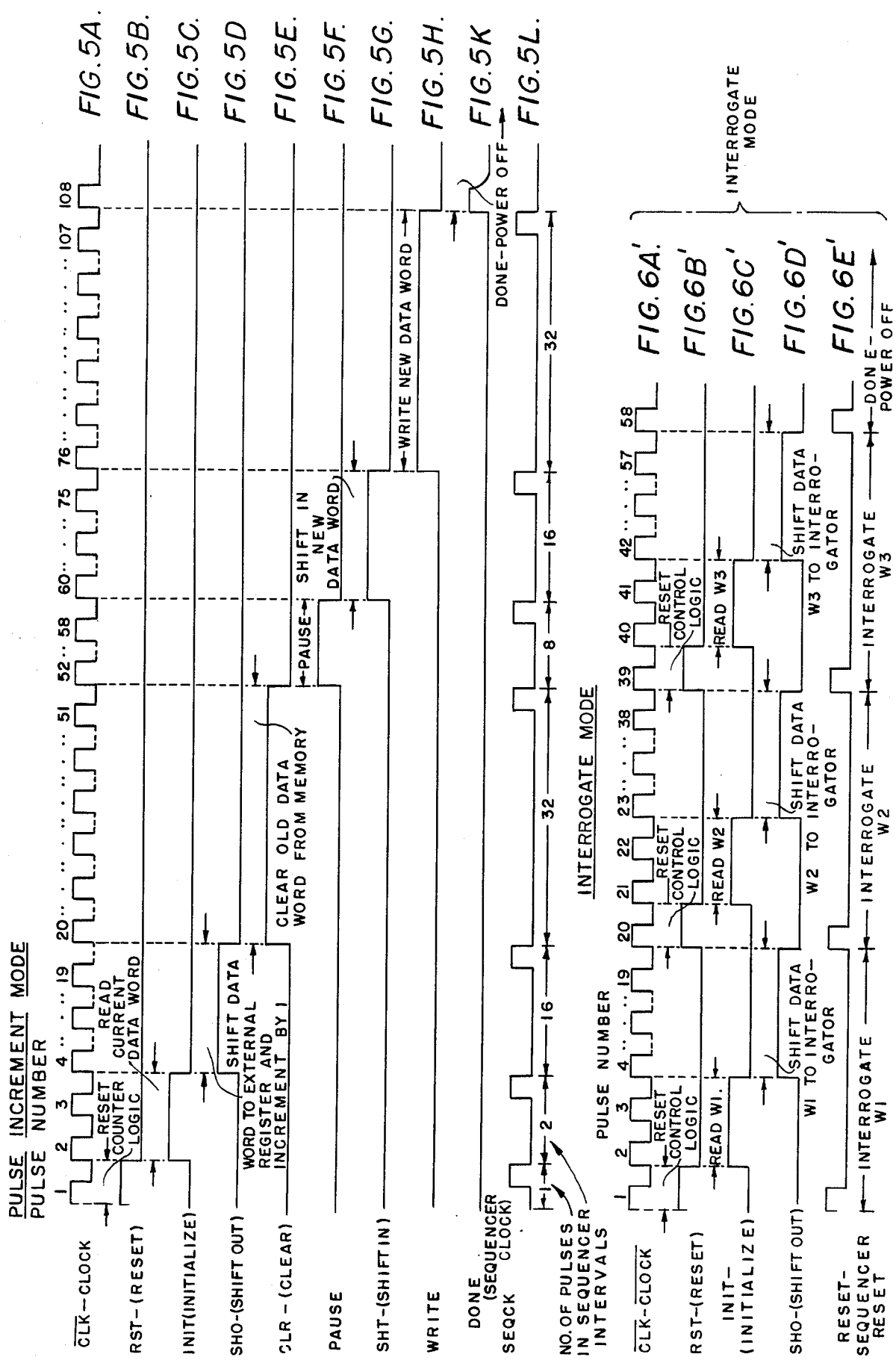

SELF-POWERED SYSTEM FOR MEASURING AND STORING CONSUMPTION OF UTILITY METER

BACKGROUND OF THE INVENTION

1. Field of the Invention

This invention relates to apparatus and methods for measuring and accumulating the customer consumption of a utility, for example water, gas or electricity, and in particular to such a system which is self-powered, requiring only an energy input from the utility meter, the output of which is being measured and stored, or the energy input from an interrogation unit.

2. State of the Prior Art

It has been a long-standing problem of utility companies dealing with the distribution of such utilities as water, gas or electricity, for example, to obtain an indication of the utility consumption by each of its customers, so that customers may be accurately billed for their consumption. It has been a typical practice for the utility company to forward an inquiry by post to the customer, requesting that the customer read out from a meter installed at his location or house, and recored by writing the current reading onto a card before returning the card to the utility company. Such a system is subject to errors in that the customer may deliberately falsify the reading and/or inaccurately record it. Alternatively, the utility company may employ "meter readers" to visit each customer location or home and take the reading, by visually observing the meter and recording in tabulated form a hand-written record of the utility consumption and the corresponding customer. Such a method is very time-consuming and thus costly, in that the meter reader must typically gain access to the interior of the customer's house, wherein the meter is located, and on many occasions will find the customer absent, thus requiring repeated returns to secure the necessary reading. In addition, such a visual and hand-written method of recording typically is very inaccurate in that the numbers making up the meter reading often are misread or inaccurately recorded.

An improvement over such methods of obtaining utility meter readings comprises a display or readout disposed remotely of the utility meter, typically in a position outside of the customer's home or place of business. Thus, the "meter reader" does not have to gain access to the interior of the customer's house or place of business to make the desired reading. Still, the reader must visually read the plurality of numbers displayed upon the remote readout or display, and record the numbers upon his log. As described above, such visual readout and recording by hand-written insertions is subject to a high degree of inaccuracy.

The assignee of this invention has previously developed a significant improvement to the aforedescribed prior art methods and apparatus for obtaining utility readings, known as the Tele-Tape Remote Readout System (TTR). In this system, the utility meter, illustratively a water meter, measures the flow of water to incrementally record upon a coupled, mechanical-type register, an indication of the amount of water consumed by the customer. In turn, an electrical signal is derived from the register upon application of a portable interrogation unit and is applied to a receptacle, typically located upon the exterior of the customer's home or place of business, whereby a portable interrogation unit carried by the meter reader to the customer's location, is coupled thereto to derive a readout signal indicative of the water consumption by the customer. More specifically, the interrogation unit takes the form of a portable device including a storage medium, typically a tape cassette of the Phillips type, upon which electrical signals are recorded indicative of the water consumption, as well as a customer identification number.

The problems associated with such a "TTR" system will become more apparent as a description of its details is made. The mechanical register associated with the water meter comprises a series of wheels, the positions of which indicate successive magnitudes, e.g. units, tens, hundreds, thousands, of the quantity of water consumed. For example, the water meter incrementally moves the register for each 100 or 1,000 gallons of water that the customer has consumed. An electrical signal is derived to indicate the position of each of the wheels and thus the water consumed, by a plurality of resistance ladders, one associated with each wheel. Selected connections are made through a plurality of switching diodes to a coupling receptacle disposed upon the exterior of the customer's home or place of business, whereby the utility reader may readily gain access to the mechanical register. In addition, a circuitboard or wiring matrix is disposed, illustratively within the external receptacle, that is so configured or wired to uniquely identify the customer.

In order to obtain a meter reading, the meter reader gains access to the remote receptacle by coupling a connector in the form of a gun through a removable face plate, whereby the interrogator gun including contacts, is coupled with contacts within the remote receptacle so that an electrical connection is made between the portable interrogation unit and the mechanical register associated with the utility meter. Upon insertion of the interrogating gun, the control logic associated with the portable interrogation unit, sequentially reads out or obtains an encoded readout signal from the resistance ladder associated with each of the wheels of the mechanical register, and a six-digit identification signal from the aforedescribed wiring matrix.

One of the significant problems associated with the TTR system is the price of manufacturing such a unit, especially when its cost is compared with the cost of large-scale, integrated (LSI) devices that are capable of performing similar functions. In particular, the mechanical encoder, including a plurality of wheels, resistance ladders and sets of contacts for interconnecting the encoding wheels and resistance ladders are relatively expensive to manufacture. In particular, the sets of contacts employed by the resistance ladder for determining the position of its encoding wheel would become corroded by moisture or contaminants in the atmosphere, unless rather expensive measures, typically in the form of coating with a noble metal such as silver or gold, are taken; otherwise, a contact resistance problem would occur such that the output signal derived from the encoding wheels would be inaccurate. Similar contact problems also are encountered in the interconnection made between the interrogating gun and the set of contacts within the external receptacle, and these mating sets of contacts must be protected by suitable coatings that will not be corroded by moisture or contaminants within the atmosphere. A further problem resides in the relatively expensive nature of encoding each utility meter with a unique identification number identifying the customer. The wiring matrix utilized in the "TTR" system typically is hand-wired to provide the unique six-digit customer identification number. Further, such a manufacturing process requires that the matrix be manufactured at the factory and then subsequently installed at the customer's location.

If modern LSI components are to be employed to provide a storage of the quantity of the utility consumed by the customer, as well as his unique identification number, several problems are encountered. First, it is contemplated to use power supplied from the line voltage available at the customer's location. If the line voltage should fail for any of a variety of reasons, the signals stored within conventional LSI memories indicative of the utility consumed as well as the customer's identification number, may well be lost. Further, if such a system were to depend upon the line voltage for energization, it would be necessary to provide a suitable connection between the line and the utility meter. In any event, the energization as well as the continued storage of the amount of the utility consumed and the customer's identification number, must be secure.

SUMMARY OF THE INVENTION

It is therefore an object of this invention to provide a new and improved system for measuring and accumulating the amount of a utility consumed by a customer, implemented by LSI-type devices of improved reliability and lower cost than prior art systems.

It is a further object of this invention to provide a system for measuring and accumulating an indication of the utility consumed by a customer, that is energized solely by pulses derived from either signals provided from the utility meter or from interrogation signals applied from an external interrogation unit to the system, to effect a readout of the stored indication of consumed utility.

It is another object of this invention to provide a new and improved system for measuring and accumulating indications of a utility consumed by a customer, wherein a data word indicative of a particular customer may be readily stored and changed at the customer location.

In accordance with these and other objects of the present invention, there is provided a system for measuring and accumulating signals or manifestations indicative of a utility consumed by a customer, e.g. water, gas or electricity, comprising a meter responsive to the consumption by the customer of a particular utility for providing signals indicative thereof, a memory for storing the utility consumption manifestations, and detector means responsive to the application of the utility consumption manifestation above a predetermined voltage level, for initiating the energization of the system.

In a specific illustrative embodiment of this invention, there is included sequence control means responsive to the detection of the utility manifestation, to control the storing of the manifestation or data word indicating the utility consumption upon the memory. In particular, the utility meter provides an output pulse-like signal, indicative of the utilization of a given quantity of the utility, e.g. a pulse for each 100 or 1,000 gallons of water consumed. In operation, the previously-stored manifestation of the utility consumed is read out and thereafter, that quantity is incremented by "1" before being restored in the memory.

In order to interrogate the system to provide an output signal indicative of the utility stored, an interrogation signal is derived and applied to the system, as from a portable interrogation unit or from a centralized unit, whereby the detector means responds to a predetermined level of the interrogation signal, to energize the system. Thereafter, the sequence control means reads out the previously-stored manifestation of the utility consumed and a manifstation or data word particularly and uniquely identifying the customer, before de-energizing the system.

The aforedescribed system is thus self-powered, not requiring battery or AC-line energization, and is solely powered by either the energy provided by the signal derived from the utility meter and/or the interrogation signal. The memory incorporated into the system requires the capability of storing electrical signals for an extended period of time, and in one illustrative embodiment of this invention comprises a non-volatile, MNOS memory.

BRIEF DESCRIPTION OF THE DRAWINGS

These and other objects and advantages of the present invention will become more apparent by referring to the following detailed description and accompanying drawings, in which:

FIGS. 2A and 2B, 3A and 3B, and 4A and 4B are detailed circuit diagrams of a system shown in FIG. 1, as assembled in a manner as shown in FIG. 4;

FIGS. 5A-5L and 6A'-6E' show the signals and the timing thereof provided by the circuit elements shown in FIGS. 2A and 2B, 3A and 3B, and 4A and 4B, as operated in a first pulse increment mode and a second interrogate mode of operation, respectively.

DETAILED DESCRIPTION OF THE PREFERRED EMBODIMENT

Figure 1:
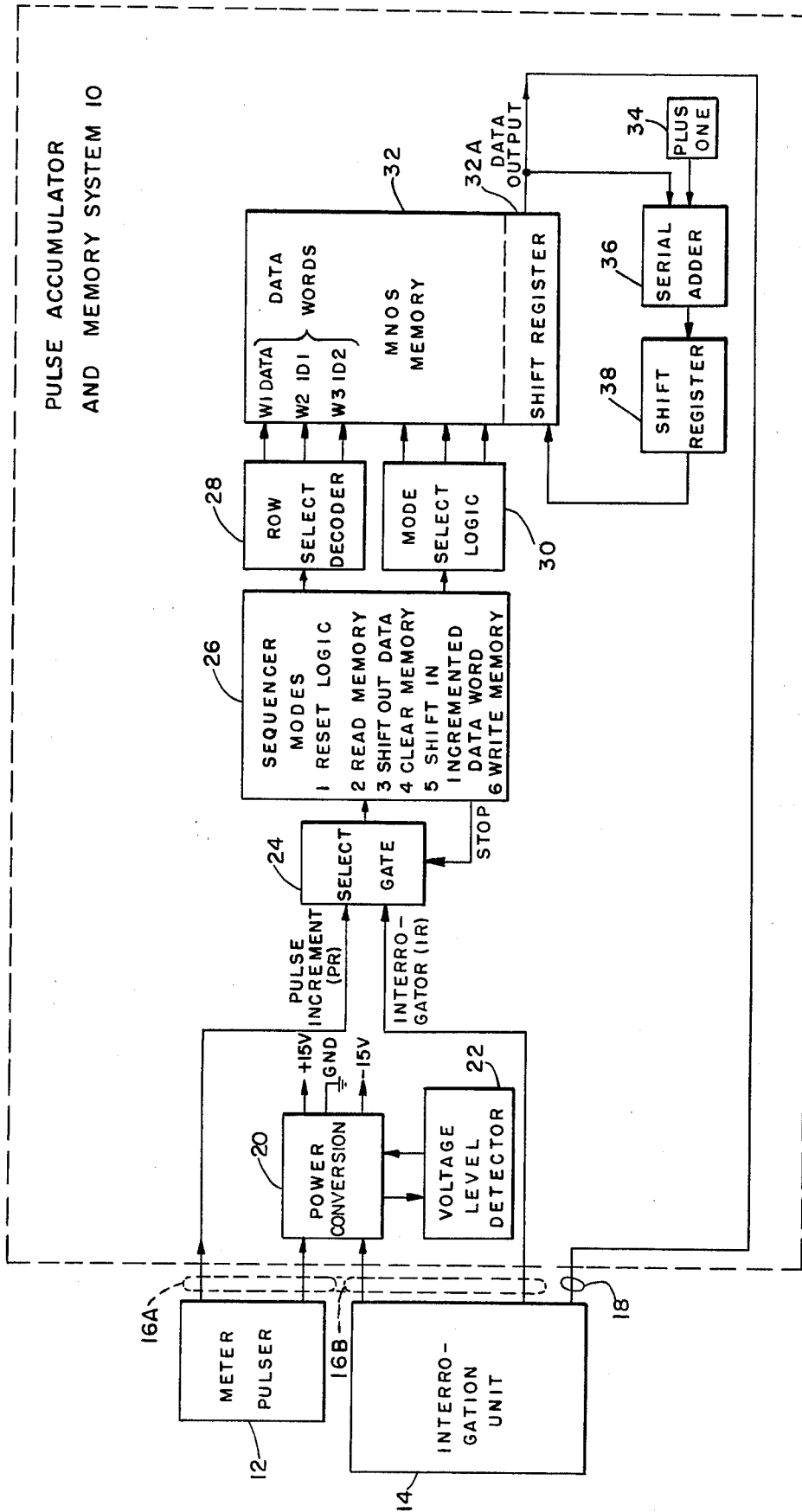
FIG. 1 is a schematic diagram in block form illustrating a system for measuring and accumulating signals or manifestations indicative of a utility consumed, and for interrogation of the accumulated signals by an external interrogation unit.

With reference to the drawings and in particular to FIG. 1, there is shown a pulse accumulator and memory system 10 in accordance with the teachings of this invention. As shown, the system 10 includes a utility meter 12 adapted to measure the consumption or flow of a particular utility, e.g. water, gas or electricity, to a customer. In one illustrative embodiment of this invention, the utility meter 12 is particularly adapted to measure the flow of water and provides an output signal or manifestation, illustratively in the form of a train of pulse-like, electrical signals, each signal indicating the consumption or flow of a quantity of water, e.g. 100 or 1,000 gallons. In one illustrative embodiment of this invention, the utility meter 12 may take the form of that meter as described in U.S. Pat. No. 3,685,353 of Gestler et al, and assigned to the assignee of this invention.

Figure 7:
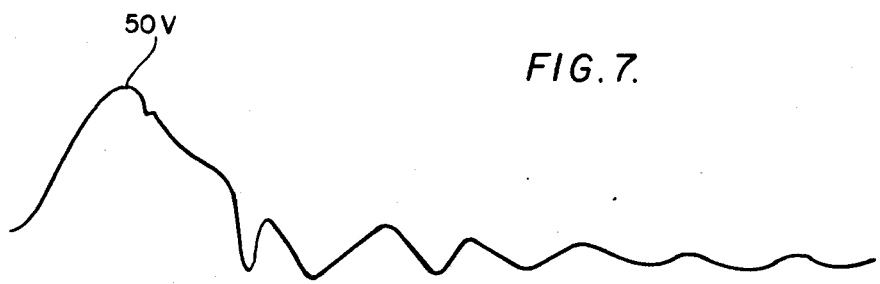
FIG. 7 is a graphical display of the pulse-like, electrical signal as derived from a utility meter, as incorporated into the system as shown in FIGS. 1 and 2A and 2B, 3A and 3B and 4A and 4B.

The output from the utility meter 12 is connected to the pulse accumulator and memory system 10 via a coupling 16A taking the form of permanent wire connections, as shown in FIG. 1. The output from the utility meter 12 is shown in FIG. 7 as comprising a pulse-like, electrical signal having an amplitude in the order of approximately 50V. The illustrative utility meter as shown in the aforenoted U.S. Pat. No. 3,685,353 is particularly designed to provide a pulse-like output having an amplitude typically in the order of about 6.4V. It is contemplated that this utility meter be slightly adapted by increasing the number of turns of its output windings, whereby a pulse-like signal of the general configuration as shown in FIG. 7 is derived, but of an increased amplitude in the order of 50V. As will be explained in detail, a significant advantage of the pulse accumulator and memory system 10 is that it is essentially self-powered in that it derives its sole energization from the electrical energy derived from either the utility meter 12 or an interrogator unit 14. Thus, in order to carry out that object, it is preferred to increase the voltage output of the pulse-like signal derived from the utility meter 12.

As shown in FIG. 1, the pulse-like signal derived from the utility meter 12 is applied to a power conversion circuit 20 and also to a voltage level detector 22. The power conversion circuit 20 is responsive to the output of either the utility meter 12 or the interrogation unit 14 to derive a power output sufficient to energize the entire system 10. The voltage level detector 22 is responsive to the increasing voltage level of the pulse-like signal of the meter 12 as it is applied to the system 10, to initiate its operation when the voltage level of the input signal increases above a predetermined level. Thus, the pulse accumulator and memory system 10 is turned on for a discrete period of time whereby it functions in its first or pulse increment mode of operation to measure and to store or accumulate the input pulse signal as derived from the utility meter 12, and subsequently, to read out in its second or interrogate mode of operation, the stored manifestation indicating the amount of the utility consumed, when a pulse train is derived from the interrogation unit 14.

As shown in FIG. 1, the utility meter 12 also applies its pulse-like output, indicative of the consumption of a given quantity of a utility, to a select gate 24. In similar fashion, the interrogation unit 14 also applies its output to the select gate 24, which responds to one of the aforementioned outputs, to select the operation of the sequencer 26 in either its first or pulse increment mode or in its second or interrogate mode. In turn, the sequencer 26 operates in either mode to control the corresponding operations of the memory 32. Though the interrogation unit 14 is described in one illustrative embodiment of this invention as portable, it is readily contemplated within the teachings of this invention that a centralized unit may be disposed remotely of the system 10 and apply via connectors, e.g. coaxial cables, their interrogation pulse train to the system 10. In the first or pulse increment mode of operation, a pulse increment signal PR is applied to select gate 24, which in turn initiates the operation of a sequencer 26 in the first mode. As indicated in FIG. 1, the sequencer 26 provides an output signal to a row select decoder 28, whereby an address signal determining which of the positions W1, W2 and W3 of a memory 32 will be addressed. At the same time, an actuate signal is derived from the sequencer 26 and applied to a mode select logic circuit 30 whereby the read, clear or write mode of the MNOS memory is selected and exercised.

Significantly, the memory 32 is of a non-volatile, MNOS type, that is capable of retaining stored charges thereon for an extended period of time without being continuously energized. In one illustrative embodiment of this invention, the memory 32 takes the form of a non-volatile, 8 × 16 memory as manufactured by the Nitron Corporation under the designation NC7030. Such a memory has the capability of storing charges thereon for an extended period of time and for reading out the signals stored thereon in an ascertainable fashion. Data words originating from the meter 12 and written with a limited amount of power, have been stored in the memory 32 for periods in excess of three years, whereas data words indicative of the customer written with greater power may be stored in memory 32 for periods in excess of twenty years. In actual use, it is contemplated that the pulse words be rewritten each time the utility meter 12 applies a pulse thereto; thus, the data word indicative of the utility utilized by the customer is being rewritten at periods significantly shorter than the demonstrated storage time of the memory 32. As seen in FIG. 1, the memory 32 includes a shift register 32A, through which data is written in and read out from the memory 32. As will be explained in the operation of the pulse increment mode, upon the receipt of a pulse from the utility meter 12, the current data word as stored at line W1 is read out and applied to a serial adder 36 whereat a +1 is added in binary fashion from a +1 circuit 34, before being stored in turn in a shift register 38, and thereafter being transferred into the shift register 32A to be re-entered at line W1 of the memory 32. More specifically, the system 10 operates in the pulse increment mode to first respond to the occurrence of a pulse from the utility meter 12 by energizing the system 10 as the pulse voltage level exceeds a predetermined level as detected by the detector 22. At that point, the operation of the sequencer 26 is initiated to first reset or initialize the entire logic of the circuitry, including decoder 28 and mode select logic 30, and to secondly transfer the memory words as contained in line W1 into the shift register 32A, before shifting out data to the serial adder 36. Thereafter, the memory 32 is cleared before the data as now stored in the shift register 38 is read back into the shift register 32A. Thereafter, the data in the shift register 32A is written back into line W1 of the MNOS memory 32. At the end of the process, after the new data word as stored in the register 32A is written into line W1 of the memory 32, the sequencer 26 applies a turn-off or stop signal to the voltage level detector 22 whereby the entire pulse accumulator and memory system 10 is de-energized. In this fashion, the energy requirements to operate the system 10 are minimized in that its operation is limited to a period of time substantially corresponding to the pulse as received from the utility meter 12.

In an interrogate request mode of operation, the interrogation unit 14 is coupled as by coupling an inductivetype coupling 16B and a light coupling 18 to the system 10, whereby an interrogate signal in the form of a burst of a clock signal, illustratively of 30KC, is applied to energize the power conversion circuit 20 and to set the select gate 24, whereby the sequencer 26 is set appropriately into the interrogate request mode. In the sequence of operation, the voltage level detector 22 first detects that the voltage as applied thereto is above a predetermined level, to energize the system 10. Though not shown explicitly in FIG. 1, the output of the power conversion circuit 20 is coupled to energize all of the circuit elements of the system 10. Before detector 22 detects the output of either the meter 12 or the interrogation unit 14, the elements of the system 10 remain unenergized, and in this state draw no power. The non-volatile memory 32 does not require energization to continue storing the manifestations indicative of the utility consumed and the customer identification. The illustrative memory 32 identified above is capable of storing such utility data words, without being energized for a prolonged period, e.g. at least three years. After the completion of either the pulse increment or interrogation mode of operation under the control of the sequencer 26, the sequencer 26 disables the system 10, thereby minimizing the power consumed by the system, enabling it to operate solely upon the energization provided by outputs of the interrogation unit 14 and/or the utility meter 12.

Upon energization, the sequencer 26 controls the transfer of the data as written at the W1 line of the MNOS memory 32 to the shift register 32A, whereby it is serially read out and applied via the optical coupling 18 to the interrogation unit 14. In an illustrative embodiment of this invention, the interrogation unit 14 comprises a storage medium, such as a tape cassette, for receiving and storing the data indicative of the total accumulated utility used by the customer. In an illustrative embodiment of this invention, the optical coupling 18 comprises a light-emitting diode that directs light onto the base region of a light-responsive transistor which in turn is coupled to the recording circuitry of the interrogation unit 14. Further, it is noted that the coupling 16B may take the form of an inductive coupling, whereby the electrical interconnection between the interrogation unit 14 and the pulse accumulator and the system 10 avoids the use of electrical contacts and their associated resistance problems.

After the readout of the data word indicative of the utility consumed, the customer identification data or number as stored at lines W2 and W3 of the MNOS memory 32 is read out via the shift register 32A and the optical coupling, to be applied to the interrogation unit 14. By the use of such an MNOS memory 32, the customer identification number may be readily changed simply by rewriting at the lines W2 and W3, a new customer identification number indicating that a new customer has moved into that home or business location. In this fashion, when it becomes necessary to change the customer identification number, it is not necessary to provide a new wired matrix, which procedure, even if done efficiently, does require several days, but may be effected in accordance with the teachings of this invention simply by entering a new data word in the memory 32. After the readout of the customer identification number, the sequencer 26 applies a turn-off signal to the voltage level detector 22, whereby the pulse accumulator memory system 10 is turned off thus completing the interrogation process of the unit 14.

Figure 2A:
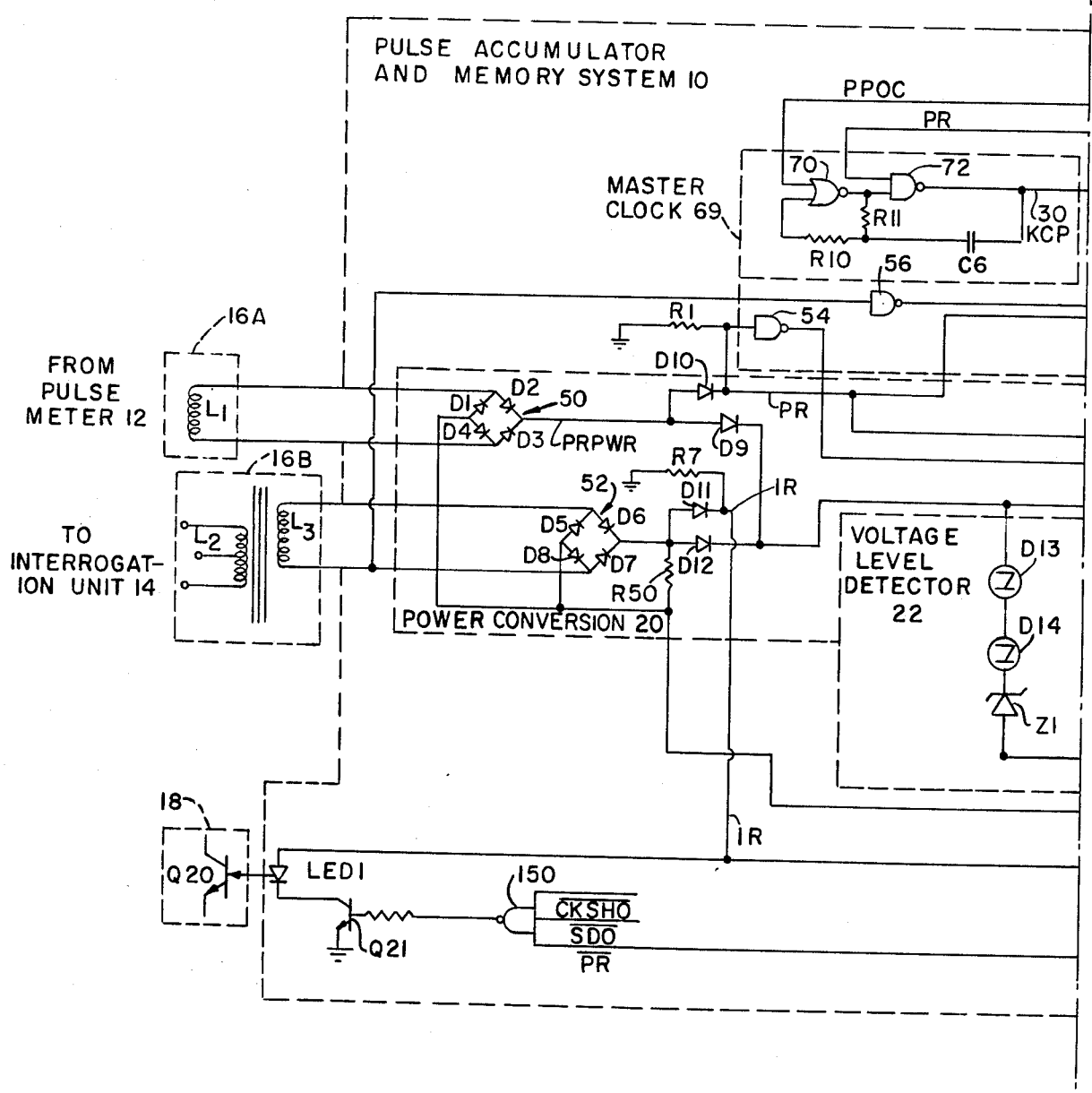

Referring now to FIGS. 2A and 2B, 3A and 3B and 4A and 4B, there is shown a detailed schematic of the elements making up the pulse accumulator and memory system 10 as generally shown in block form in FIG. 1. It will be recognized that the circuits generally shown in FIG. 1 by blocks are identified in FIGS. 2A and 2B, 3A and 3B and 4A and 4B by enclosing the elements making up these circuits by dotted lines and supplying a like label to the enclosed elements of a circuit. As shown in FIG. 2A, the input from the utility meter 12 is coupled via an inductive coupling 16A taking the form of a secondary winding which applies the utility meter output pulse to the power conversion circuit 20 and in particular to a diode bridge 50 comprised of diodes D1, D2, D3 and D4, whereby the input signal is rectified to provide from its terminal 16 a positive power signal PPWR via a blocking diode D9 to the voltage level detector 22 and via blocking diode D10 to the select gate 24. As the signal applied to the blocking diode D10 goes positive, it conducts to provide a pulse increment signal PR via a OR gate 58 to the select gate 24 and in particular to provide at least in the first or pulse increment mode of operation, an enabling signal to NAND gate 60.

Figure 3A:
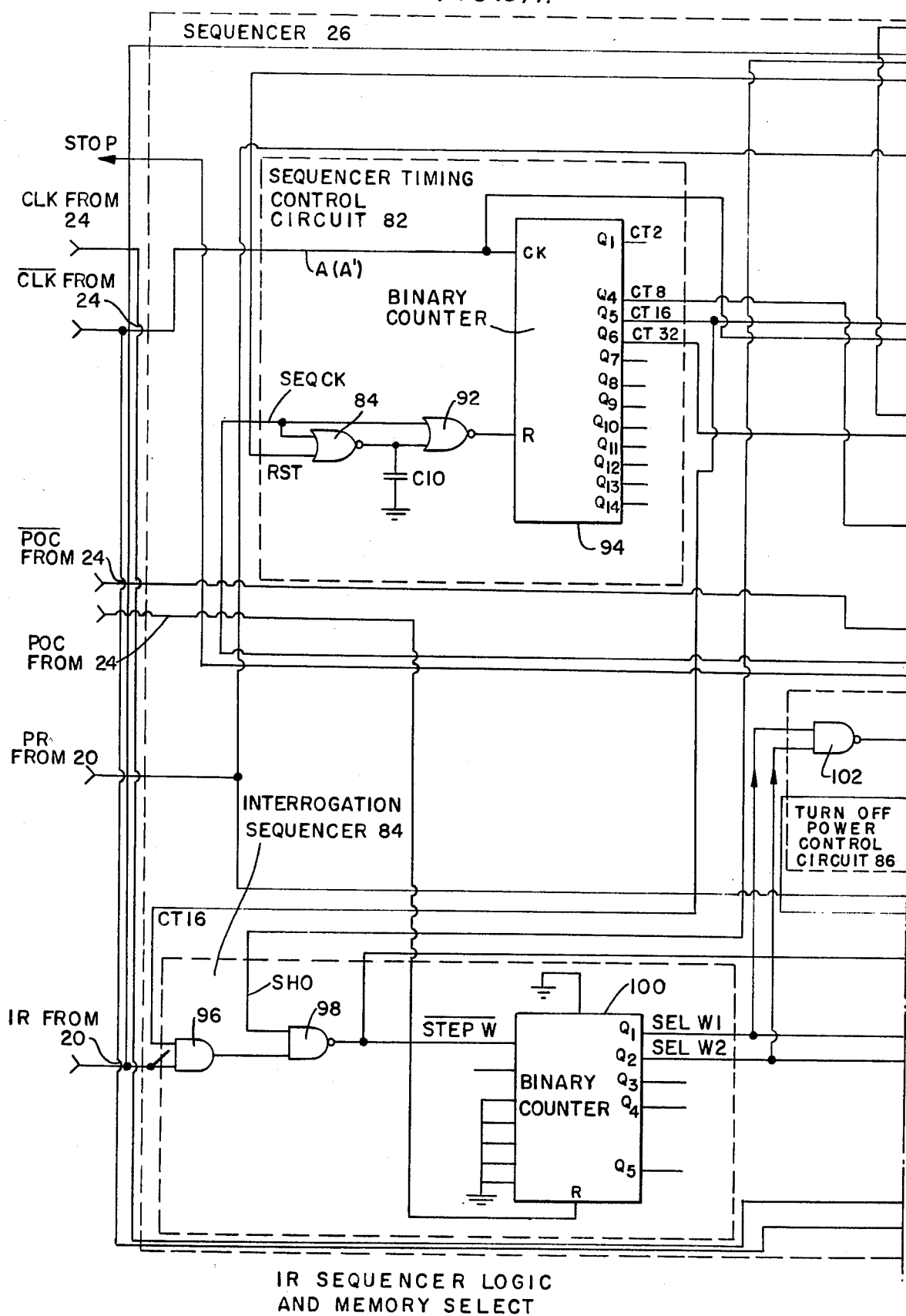
Figure 3B:
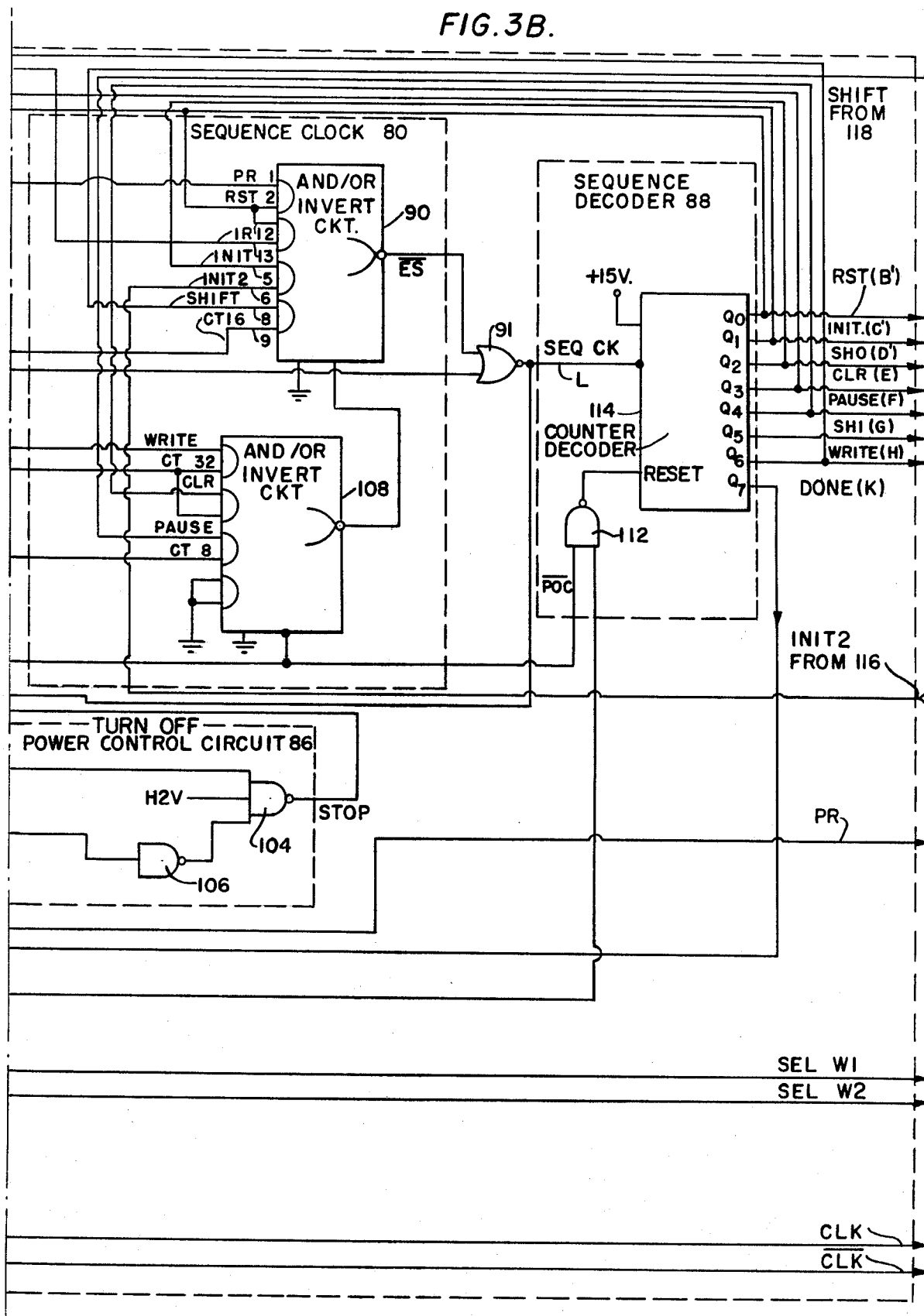

The select gate 24 includes a free-running oscillator or master clock 69, as shown in FIG. 2A, that is actuated by the application of the pulse increment signal PR as derived from the blocking diode D10 and a pulse request, power on, clear signal PPOC, indicating that the power as detected by the voltage level detector 22 is above a predetermined level and that the system 10 is operative in the pulse increment mode, as will be explained in detail later. Thus, in the first or pulse increment mode of operation, the master clock 69 is actuated. As shown in FIG. 2A, the master clock 69 comprises a NOR gate 70, the output of which is applied to a first input of an NAND gate 72 and whose second input is the aforementioned pulse increment signal PR. In turn, the output of the NAND gate 72 is fed back via capacitor C6 and resistor R10 to the other input of NOR gate 70, with a resistor R11 being interconnected from the point of interconnection between capacitor C6 and resistor R10, to the point of interconnection between the output of NOR gate 70 and NAND gate 72. As is well-known in the art, the values of capacitor C7, resistor R10 and resistor R11 are chosen to provide a free-running clock, the output of which, as derived from NAND gate 72, is 30KC. When enabled in the pulse increment mode of operation, the NAND gate 60 (see FIG. 2B) applies the 30KC clock signal to a monostable multivibrator 62, whose Q and $\bar{Q}$ outputs provide the clock signals CLK and $\overline{CLK}$. The waveform of the clock signal $\overline{CLK}$ is shown in each of FIGS. 5A and 6A'; as seen in FIG. 2B, the $\overline{CLK}$ output is identified with the numerals A and A' to correspond with FIGS. 5A and 6A'. This notation will be used to make a correspondence between the signal waveforms as shown in FIGS. 5 and 6 and their sources as shown in the detailed schematic of FIGS. 2A and 2B, 3A and 3B and 4A and 4B. After the operation of the pulse accumulator and memory system 10 in each of its pulse increment and interrogator request modes of operation, a stop signal is developed by a turn-off power control circuit 86 of the sequencer 26, as shown in FIGS. 3A and 3B, and is applied to the monostable multivibrator 62 to terminate the generation of the clock signals CLK and $\overline{CLK}$, whereby the system is disabled.

The pulse increment signal PR is applied further to the select gate circuit 24 and in particular to a NOR gate 64, the output of which provides the interrogate request, power on, clear signal (IPOC), and is further applied to a first input of NOR gate 68 whose output is the power on, clear signal $\overline{POC}$. As shown in FIG. 2B, the output of NOR gate 68 also is applied to an inverter 69 which provides the power on, clear signal POC. The pulse increment signal PR also is applied to a delay circuit comprised of resistor R6 and capacitor C6, which, after a predetermined delay as determined by the values of the components R6 and C6, provides a pulse request power on, clear signal PPOC that is applied via NOR gate 66 to one input of the NOR gate 68 and also to provide the power, clear signal $\overline{POC}$. Further, a feedback signal as derived from the output of NOR gate 68, i.e. the power on, clear signal $\overline{POC}$ is applied via resistors R4 and R5 to NOR gates 64 and 66, respectively.

In the first or pulse increment mode of operation, a PR signal is developed when a pulse-like signal is derived from the utility meter 12 and is applied to the power supply 20 and in particular through the resistor R6 to charge the capacitor C3, dependent upon the time constant of the aforementioned elements, e.g. 4 msec. Thus, after this time constant, the signal applied to an input of the NOR gate 66 (see FIG. 2B) is driven to a logic "1", whereby after the aforementioned time constant of 4 msec., the output of the NOR gate 66 is forced to "1". In the first or pulse increment mode, the output of the NOR gate 66 is initially "0", whereby the inputs to NOR gate 68 cause output $\overline{POC}$ to be driven to "1" after the predetermined interval dependent upon the time constant of elements R6 and C3, e.g. 4msec. A relatively short reset period is necessary during the first or pulse increment mode of operation in that the pulse-like signal received from the utility meter 12 is illustratively approximately 25msec, and it is desired to reset the logic of the remaining portions of the system 10 during the initial rise time of the pulse-like signal received from the utility meter 12. Further, the output of the NOR gate 68 is applied via resistors R5 and R4 to maintain the inputs to the NOR gates 66 and 64 at logic "1" so that their outputs are held at a "0" level to ensure proper operation of the system 10.

The pulse interrogate signal IR is developed in the interrogate mode of operation, as will be explained in greater detail below, when the pulse-like output signal from the interrogation unit 14 is applied to the pulse accumulator and memory system 10 and is applied, as shown in FIG. 2B, to the delay network comprised of resistor R3 and capacitor C2, whereby capacitor C2 is charged. Before the application of the pulse interrogate signal IR, the inputs to the NOR gate 64 both are "0", whereby a "1" output is derived. In the second or interrogate mode, the increment signal $\overline{PR}$ is high, whereby the output of the NOR gate 66 is low, whereby the inputs to the terminals of the NOR gate 68 are "1" and "0", respectively, whereby a "0" output signal $\overline{POC}$ is derived. Dependent upon the time constant of the time delay circuits R3 and C2, a charge builds up upon capacitor C2, placing a "1" at an input of the NOR gate 64, whereby its output is directed to low after a period dependent upon the values of the impedance of elements R3 and C2, e.g. 20msec. Thus, the output $\overline{POC}$ of the NOR gate 68 remains low for this corresponding period, e.g. 20msec, whereby a reset signal in the form of the power on, clear signal $\overline{POC}$ is applied to the sequencer 26, as will be explained in detail. In this instance, it is understood that the reset signal $\overline{POC}$ remains low for a period of 20msec, whereby in the second or interrogate mode, a selected length of reset pulse is determined to ensure that the logic circuitry of the sequencer 26 is reset. The signal $\overline{POC}$ also is applied via a feedback path via resistor R4, whereby the high or "1" signal applied to a terminal of the NOR gate 64 is further reinforced to ensure that the output of the NOR gate 64 is directed to "1" and through resistor R5 to ensure that an input terminal to NOR gate 66 is held at "1" whereby its output remains at "0".

As shown in FIG. 2A, the pulse request signal PR also is applied via the blocking diode D9 to the voltage level detector 22 and in particular to a pair of four-layer diodes D13 and D14, which turn on when the voltage level of the pulse request power signal PRPWR increases to a voltage level in excess of approximately 23V. As the voltage continues to rise, a reference voltage of approximately 12V is established across the zener diode Z1, and when the bias voltage established across diodes D13, D14 and Z1 reaches 35V, conduction occurs and base current is supplied which renders transistor Q1 (see FIG. 2B) conductive to apply voltages across zener diodes Z2 and Z3, as stabilized by the series-connected capacitors C4 and C5, respectively. Further, the point of interconnection between resistor R9 and zener diode Z2, is connected to zener diode Z4, whereby a potential of −8V is derived from the negative electrode of zener diode Z4, and a reference voltage of −20V is derived from the negative electrode of zener diode Z2. The potentials of −8V and −20V are particularly adapted for use with those elements of an MNOS technology, including the memory 32. A reference voltage of +12V is derived from the positive electrodes of zener diode Z3, which potential is particularly suitable for energizing CMOS-type elements as are incorporated within the system 10.

As can be seen in FIG. 2A, the diodes D10, D9, D11 and D12 serve to prevent voltage as established by the power supply 20 to be fed back via the diode bridges 50 and 52 to their corresponding input connections, and further serve to isolate the pulse-like signal from the meter 12, from the interrogate request signal from the interrogation unit 14.

In the interrogation mode of operation, an interrogate signal in the form of a burst of a 30KC signal is applied via inductive coupling 16B and in particular to primary winding L2 which is inductively coupled to secondary winding L3, whereby the interrogate signal of 30KC is applied to a second diode bridge 52 comprised of diodes D5, D6, D7 and D8, whereby a rectified voltage is applied across resistor R50 and an interrogation request signal IR is applied via blocking diode D11 to the select gate 24 and via blocking diode D12 to the voltage level detector 22. The voltage level detector 22 is turned on to enable the discrete voltages of +12V, −8V and −20V to various portions of the circuitry in the manner as explained above.

In addition, the interrogation signal is of a 30KC frequency and provides a direct clock signal, as will become clear from the following. In particular, the 30KC interrogate signal is applied via an inverter 56 (see FIG. 2A), OR gate 58 and enabled NAND gate 60 (see FIG. 2B), to the monostable multivibrator 62, whereby clock signals CLK and $\overline{CLK}$ are provided. It is understood that in the second, interrogation request mode of operation, the master clock 69 is disabled. Further, the interrogation request signal IR also is applied to energize a light-emitting diode LED1 that emits radiation into the base of a transistor Q20, thereby effecting the conductance of this transistor Q20; in this fashion, the optical coupling 18 is provided between the LED1 and the transistor Q20, whereby utility accumulation data signals are derived, as will be explained, from the memory 32 and applied to selectively actuate transistor Q21.

As shown in FIG. 2A, the shift data output signal $\overline{SDO}$ is applied to one input of a NAND gate 150 that is further enabled by the application of the $\overline{PR}$ signal indicating the absence of a pulse interrogate signal and a clock shift-out signal ($\overline{CKSHO}$). In the presence of these three signals, the NAND gate 150 provides an output whereby the transistor Q21 is turned on to allow the LED1 to emit a light onto the transistor Q20. It is understood that transistor Q20 is interconnected to the recording circuitry of the portable interrogation unit 14 as generally described above, whereby the data words indicative of the utility consumed by the customer and of his customer identification number are applied to and recorded upon the storage medium of the portable interrogation unit 14.

As shown in FIG. 2A, a resistor R7 is interconnected to the negative electrode of the blocking diode D11, and is selected to be of a relatively high impedance, i.e. 1meg$\Omega$, to ensure that if the interrogation request signal IR is not present, the negative electrode of diode D11 is placed at a ground potential. In a similar fashion, a resistor R1 of a relatively high value, e.g. 1meg$\Omega$, is interconnected between the negative electrode of blocking diode D10 and ground, to ensure that if the pulse increment signal PR is not selected, this circuit point is placed at ground potential.

The output signals are derived from the select gate 24 appearing upon the right-hand margin of FIG. 2, are applied to the sequencer 26 as shown in detail in FIGS. 3A and 3B. In particular, the clock signal $\overline{CLK}$, as shown in each of FIGS. 5A and 6A', is applied to the clock input of a binary counter 94 (see FIG. 3A), whose Q1, Q4, Q5 and Q6 output terminals are selectively used to time the control operations of the sequencer 26. In particular, the binary counter 94 whose output changes state from its Q1 output for every clock input, from its Q4 output for every eight clock inputs, from its Q5 output for every sixteen inputs, and from its Q6 output for every thirty-two clock inputs. Further, the inverted power on, clear signal $\overline{POC}$ is applied to a sequencer decoder 88 (see FIG. 3B) and in particular via NAND gate 112 to reset its counter decoder 114. The outputs as derived from the Q0 to Q7 terminals of the counter decoder 114, provide the control signals reset RST, initialize INIT, shift-out SHO, clear CLR, pause, shift-in SHI, write and done, whose waveforms are illustrated, respectively, by FIGS. 5B to 5K. These signals in turn are used to control the shifting out of data from the memory 32, adding or incrementing by "1" the previously-stored data word indicative of the previous total of utility consumed by the customer, clearing the memory 32 and shifting in and writing the new incremented data word, before generating a done signal whereby the power is turned off. The inverted clock $\overline{CLK}$ signal also is applied to a NOR gate 91 to generate a sequence clock signal SEQ CK, shown in FIG. 5L, as comprised of a series of timed pulses to increment the counter decoder 114 upon the application of each such pulse in a proper, timed relationship to shift the counter decoder 114 to the next of its control signals, as enumerated above, and to reset the binary counter 94 to begin timing the next sequence of operations.

Figure 4A:
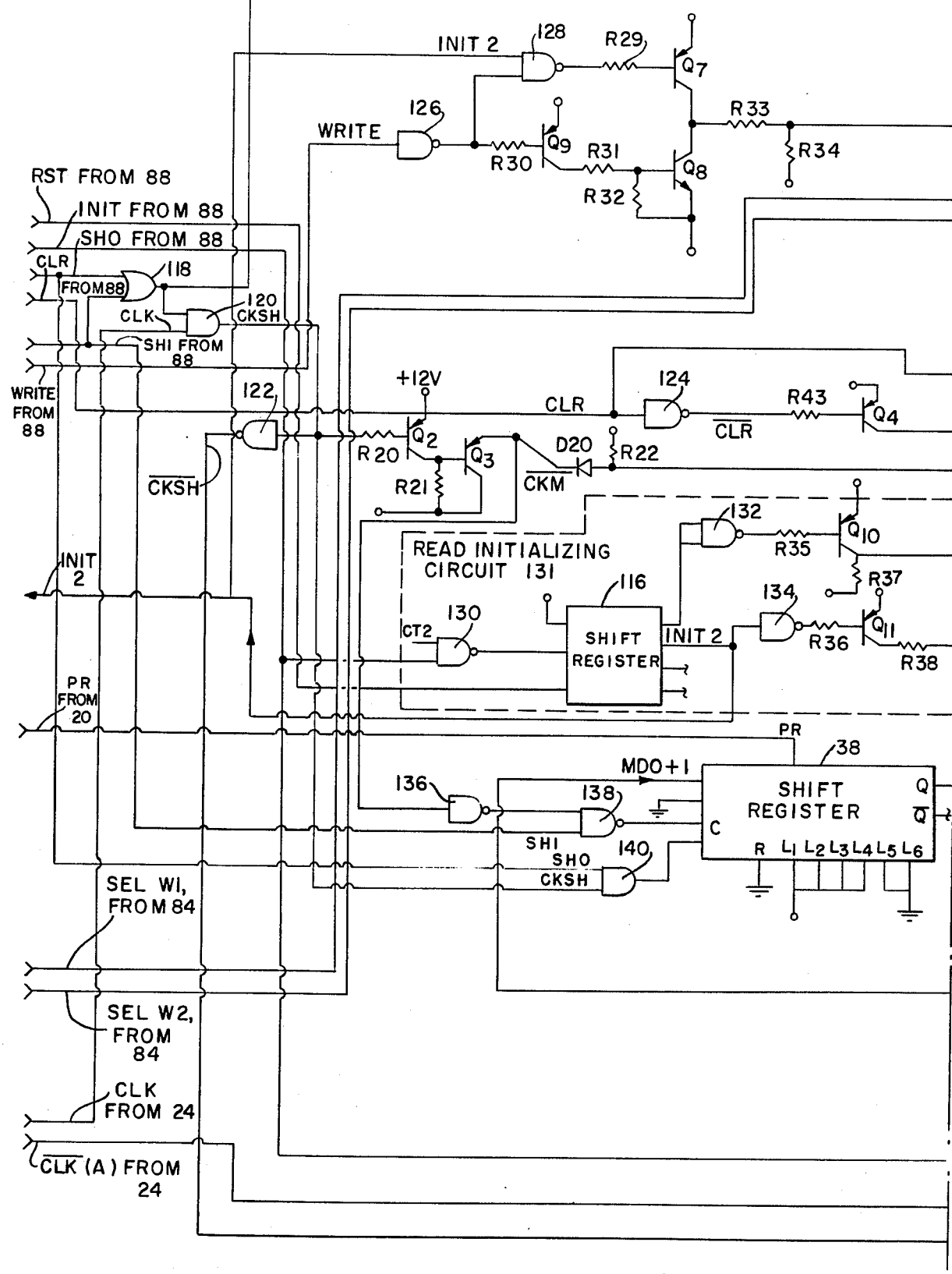
Figure 4B:
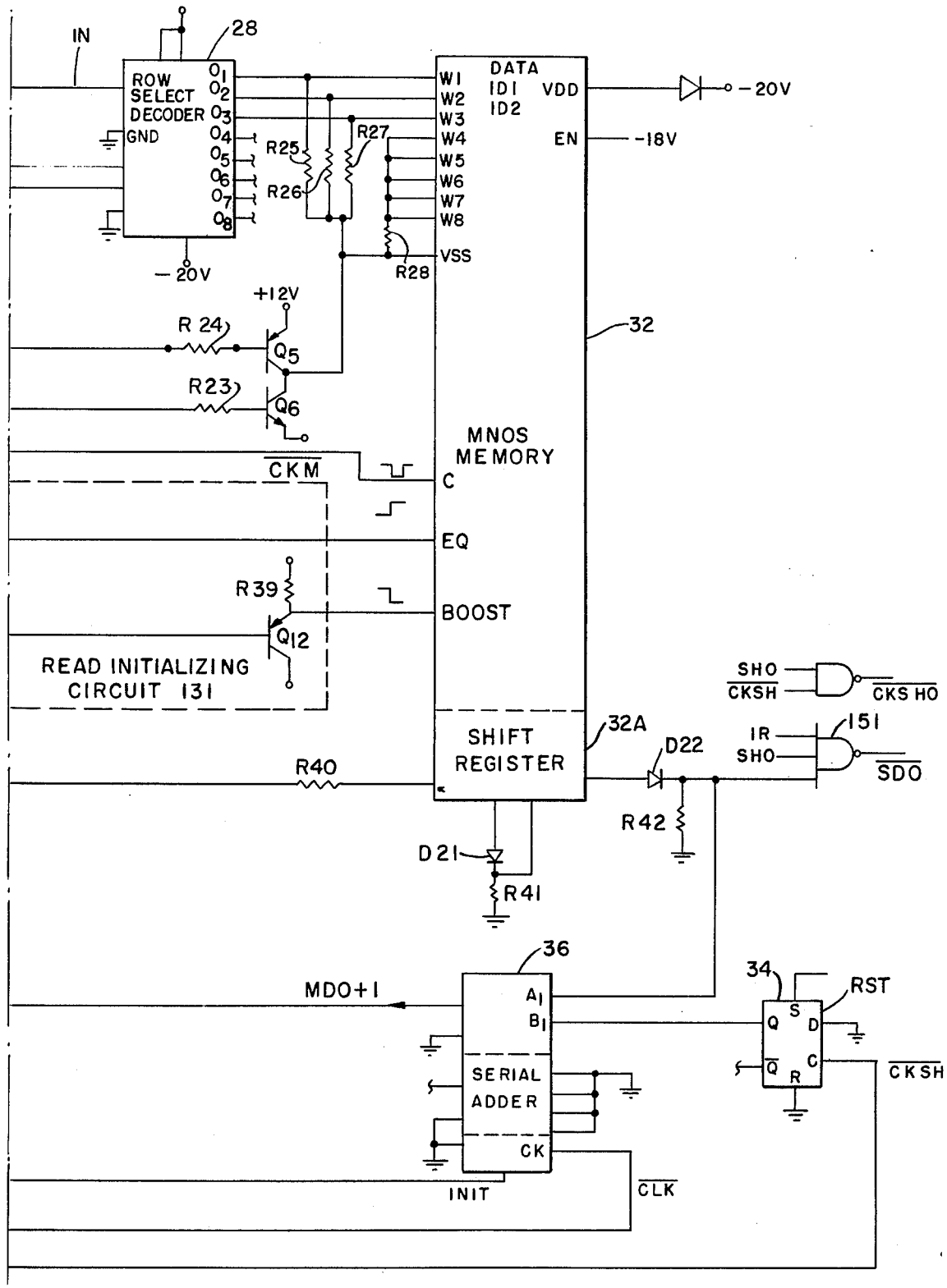

To initiate the first or pulse increment mode of operation, the pulse increment signal PR is generated as indicated above, and is applied to the AND/OR invert circuit 90 (see FIG. 3B). Upon application of a reset signal in the form of the inverted power on, clear signal $\overline{POC}$, the counter decoder 114 generates a reset signal RST (see FIG. 5B), which is applied to the second terminal of the AND/OR invert circuit 90, whereby its output signal $\overline{ES}$ is generated to enable NOR gate 91, whereby the next sequence clock signal SEQ CK is applied to the clock input of the counter decoder 114 to shift its output to its next terminal, whereby an initialize signal INIT is generated, as shown in FIG. 5C. The initialize signal INIT is applied to the input terminal 5 of the AND/OR invert circuit 90 and also to the read initializing circuit 131, as shown in FIGS. 4A and 4B.

As will be explained in detail later, the read initializing circuit 131 prepares or initializes the MNOS memory 32 to be read out for a period corresponding to two clock pulses, which timing is provided by the NAND gate 130 and the shift register 116 of the initializing circuit 131. Upon the completion of the initializing step, the shift register 116 generates an initializing complete signal INIT2, which is applied from the circuit 131 to the input terminal 6 of the AND/OR invert circuit 90, whereby the output signal $\overline{ES}$ is generated to generate the next sequencer clock pulse SEQ CK to shift the counter decoder 114 to its next output, whereby a shift-out signal SHO is generated as shown in FIG. 5D. The shift-out signal SHO is applied to the OR gate 118, as seen in FIG. 4A, whereby a shift signal is generated and applied to the input terminal 8 of the AND/OR invert circuit 90. Further, the shift signal is further applied to an AND gate 120, whereby it is anded with the clock signal CLK to generate a clock shift signal CK SH which is applied via AND gate 140 to the shift register 38, which in turn effects a transfer of data from shift register 32A. The function of data transfer from W1 to 32A is achieved in response to the row select signal W1, output from gate 132 and the signal INIT2.

As shown in FIG. 3B, the output signal $\overline{ES}$ of the AND/OR invert circuit 90 initiates the sequence clock signal SEQ CK which is generated and applied to the sequencer timing control circuit 82 (see FIG. 3A) and in particular to its NOR gate 92 to reset the binary counter 94. Upon the occurrence of the previous sequence clock signal SEQ CK, the binary counter 94 is reset and after receipt of the next sixteen clock pulses $\overline{CLK}$, there is generated from its Q5 terminal a pulse which is applied to the input terminal 9 of the AND/OR invert circuit, along with the shift signal to its input terminal 8, whereby its output signal $\overline{ES}$ is generated and the next sequence clock signal SEQ CK is applied to the counter decoder 114, whereby its output is shifted and a clear signal CLR is generated as shown in FIG. 5E. The clear signal CLR is applied as shown in FIG. 3B to an input terminal of the AND/OR invert circuit 108, which in effect is cascaded with similar circuit 90. Further, the clear signal CLR is applied through an appropriate voltage shifting circuit as will be explained in detail later, to the address input terminals corresponding to lines W1, W2 and W3 of the MNOS memory 32, whereby data previously stored at these lines of the memory 32 is cleared.

Upon the occurrence of the previous sequence clock signal SEQ CK, the binary counter 94 again is reset and after the occurrence of thirty-two clock pulses $\overline{CLK}$, its Q6 output is applied to an input terminal of the AND/OR invert circuit 108, whereby the next output $\overline{ES}$ and sequence clock signal SEQ CK are generated to shift the output of the counter decoder 114, to generate a pause signal, which is applied as shown in FIG. 3B, to an input terminal of the AND/OR invert circuit 108. As indicated in FIG. 5E, the pause step lasts for a count of eight clock pulses, permitting the memory 32 to settle after effecting a clear of previous data before commencing the following sequence step of shifting data in.

As explained above, the binary counter 94 is reset with the occurrence of the previous sequence clock signal SEQ CK and after the occurrence of eight clock pulses CLK, it generates and applies its count eight signal CT8 to the input terminal 6 of the AND/OR invert circuit 108, whereby the next signal $\overline{ES}$ and sequence clock signal SEQ CK are generated so that the counter decoder 114 shifts to its next output, generating a shift-in SHI signal as shown in FIG. 5G, during which the new data word as incremented by a single pulse is shifted from the shift register 38 in serial fashion into the shift register 32A of the memory 32. Briefly, as seen in FIG. 4A, the shift-in signal SHI is applied via NAND gate 138 to the shift register 38 to serially shift the new data word therefrom and into the shift register 32A. Further, the shift-in signal SHI also is applied to the OR gate 118 (see FIG. 4A) to generate a shift signal which is applied as shown in FIG. 3B to the input terminal 8 of the AND/OR invert circuit 90. After the occurrence of the next sixteen clock pulses CK as timed by the binary counter 94, the AND/OR invert circuit 90 generates its output $\overline{ES}$ and subsequently a sequence clock signal SEQ CK is generated and applied to the counter decoder 114 whereby it shifts to its next output signal, write, as shown in FIG. 5H. The write signal lasts for a pulse count of thirty-two, during which the incremented data word indicative of the new total of utility consumed by the customer is written into line W1 of the memory 32. As indicated in FIG. 3B, the write signal is applied to an input terminal of the AND/OR invert circuit 108 and after the occurrence of the next thirty-two pulses, beginning with the previous sequence clock signal SEQ CK, a count-32 signal CT32 is generated from the Q6 output of binary counter 94 to actuate the AND/OR invert circuit 108, thus causing the output $\overline{ES}$ and the sequence clock signal SEQ CK to be generated, whereby the counter decoder 114 is shifted to its next output signal, done, as shown in FIG. 5K. The done signal is applied as shown in FIGS. 3A and 3B to the turn-off power control circuit 86 and in particular via inverter 106 to an input of NAND gate 104. In the absence of the address signals SEL W1 and SEL W2, the turn-off power control circuit 86 generates a stop signal which in turn is applied to the select gate 24 (see FIG. 2B) and in particular to its monostable multivibrator 62, to terminate the generation of clock signals CLK and $\overline{CLK}$, thus effecting the deactuation of the pulse accumulator and memory system 10.

In the second or interrogate request mode of operation, the interrogator request signal IR is derived from the blocking diode D11 (see FIG. 2A), and is applied to the interrogation sequencer 84 (see FIG. 3A) and also to the sequence clock 80 and in particular to the input terminal 13 of the AND/OR invert circuit 90. In operation, upon receipt of the interrogate signal in the form of a burst of 30KC from the interrogation unit 14, an interrogation request signal IR is developed and applied to the interrogation sequencer 84, and power on, clear signals POC and $\overline{POC}$ are applied, respectively, to the sequence decoder 88 and in particular through its NAND gate 112 to its counter decoder 114, and to the interrogation sequencer 84 and in particular to its binary counter 100, whereby each of the counter decoder 114 and the binary counter 100 is reset. As a result, the counter decoder 114 provides a reset signal RST, as shown in FIG. 6B', which is applied to terminal 12 of the AND/OR invert circuit 90, whereby its output signal $\overline{ES}$ and therefore a sequence clock signal SEQ CK is applied to the counter decoder 114, whereby its output is advanced to provide an initialize signal INIT as shown in FIG. 6C'. The initialize signal INIT is applied to the read initializing circuit 131, as shown in FIG. 4A, and in particular via the NAND gate 130 to a shift register 116. After the completion of the initializing process, whereby various initializing signals are applied to the MNOS memory 32, the shift register 116 generates its end-of-initializing signal INIT2 which is applied to terminal 6 of the NOR gate of the AND/OR invert circuit 90 (see FIG. 3B), whereby its output $\overline{ES}$ and a sequence clock signal SEQ CK are generated, whereby the counter decoder 114 is shifted to its next output, a shift output signal SHO, as seen in FIG. 6C'.

In the course of the initialize or read step, the end-of-initialization signal INIT2 is applied via a switching circuit comprising NAND gate 128 and transistor Q7 from the shift register 116 to the row select decoder 28 of FIG. 4B, along with addressing signals SEL W1 and SEL W2, whereby the decoder 28 addresses the row W1, causing the data stored in that row W1 to be transferred from the MNOS memory 32 to the memory's internal shift register 32A. In particular, the row that is addressed is controlled by the binary counter 100 according to the following truth table:

|   | SEL W1 | SEL W2 |
|---|--------|--------|
| A. | 0 | 0 - ADDRESS W1 |
| B. | 0 | 1 - ADDRESS W2 |
| C. | 1 | 0 - ADDRESS W3 |
| D. | 1 | 1 - END OF INTERROGATE |

In its initial condition after being reset, the binary counter 100 provides a 0,0 output which is applied to the row select decoder 28, whereby row W1 is addressed as indicated above. At the end of the read sequence, as indicated by the end-of-initialization signal INIT2, the shift-out signal SHO, generated as explained above, is applied via OR gate 118 to AND gate 120, as shown in FIG. 4A, whereby a clock signal is enabled therethrough to provide the shift clock signal CKSH to the memory 32 in a manner as will be more fully explained, whereby the sixteen data bit output word is transferred serially from the shift register 32A via diode D22 and NAND gate 151 to be transmitted via the enabled NAND gate 151 to controllably turn on and off the transistor Q21, whereby the LED1, as shown in FIG. 2A, is caused to emit light onto transistor Q20 of the portable interrogation unit 14, whereby the read-out data word may be stored therein.

Upon the generation of the previous sequence clock signal SEQ CK, the binary counter 94 is reset as previously explained, and after the occurrence of the next sixteen clock pulses, the counter 94 provides a count-16 signal, CT16, which is applied to the AND gate 96 (see FIG. 3A), whose output in turn is applied to the NAND gate 98, whereby its output is applied to shift or step the binary counter 100 so that its output from its terminals Q1 and Q2 are "0" and "1", respectively. The NAND gate 98 also is applied to the NAND gate 112 of the sequence decoder 88, whereby the counter decoder 114 is reset, whereby a second read step occurs. In particular, in referring to the above-given truth table, the output of the binary counter 100 as applied to the row select decoder 28 of FIG. 4B, permits the addressing of the second row W2 and the shift of its data therefrom to the memory shift register 32A. Upon being reset by the output of NAND gate 112, the counter decoder 114 provides a reset signal RST, as shown in FIG. 6D'. With reference to FIGS. 6B', 6C' and 6D', a second series of reset, initialize or read, and shift-out steps occur, whereby the data stored in the second row W2 indicative of the customer ID, is transferred to the memory shift register 32A and thereafter shifted via the optical coupling 18 to the external interrogation unit 14. In similar fashion, at the end of the step of reading the second row of the memory 32, a count 16 signal CT16 is applied via AND gate 96 and NAND gate 98 to step the binary counter 100, whereby its output assumes a "1" and "0" at its terminals Q1 and Q2, respectively, whereby the row select decoder 28 causes the third row W3 of the memory 32 to be addressed. Thus, during the third sequence of steps, data from the third row indicative of the customer identification number is read out and applied to the memory shift register 32A and thereafter shifted out to the external portable interrogation unit 14.

With reference to FIGS. 4A and 4B, the details of the circuitry associated with the reading and writing of data into and from the memory 32 now will be explained in more detail. In order to write data into the memory 32 and in particular into row W1 thereof, after the data has been incremented by the serial adder 36 and shifted during the shift-in step from the shift register 38 into the memory's shift register 32A, a write signal is derived from the Q6 output of the counter decoder 114 (see FIG. 3B) and is applied, as shown in FIG. 4A, via inverter 126 and resistor R30 to the base of transistor Q9, which is turned on, whereby a positive-going signal is applied via resistor R31 to the base of transistor Q8, turning it on to apply a negative signal via resistor R33 to the input terminal of row select decoder 28, whereby the write operation is effected. Further, the end of the initialize or read step is indicated by a signal INIT2, as explained above, that is derived from the shift register 116 and is applied via NAND gate 128 and resistor R29 to turn on transistor Q7, whereby a positive-going signal is applied via resistor R33 to the input terminal "IN" of row decoder 28, whereby the row select decoder 28 is disabled from effecting a reading operation. Therefore, during that time period when read operations are not being performed, the row select decoder 28 and therefore the memory 32 are not permitted to read out data from the memory 32.

During the clear step of the pulse increment mode of operation, a clear signal CLR is generated from the counter decoder 114 of the sequence decoder 88 (see FIG. 3B) and is applied, as shown in FIGS. 4A and 4B, via inverter 124 and resistor R43 to successively turn on transistors Q4 and Q6, whereby a −20V pulse is applied via resistors R25, R26 and R27, respectively, to the address inputs of rows W2 and W3, and also to the substrate upon which the memory 32 is constructed, while a +12V signal is applied by the row select decoder 28 to row W1 so that the data at row W1 is cleared. At other times when a clear signal is not generated and in particular during the write cycle, the transistor Q5 is turned on, so that a +12V signal is applied to the resistors R25, R26 and R27, and appropriate biasing voltage is established at the input addresses for rows W1, W2 and W3, whereby the row select decoder 28 may selectively apply its write signal of −20V to one of the rows W1, W2 or W3.

During either a shift-out or shift-in of data to or from the memory 32 and the memory shift register 32A, a shift-out signal SHO and a shift-in signal SHI are generated, both by the counter decoder 114 and applied to the OR gate 118 (see FIG. 4A) which in turn generates a shift signal applied to enable the AND gate 120 whereby the clock signal CLK is permitted to pass thereto, providing a shift clock signal CKSH, which is applied via resistor R20 to the base of transistor Q2 and from its output collector to the base of transistor Q3, whereby an inverted memory clock signal CKM is applied to shift in serial fashion the data from the shift register 32A to the serial adder 36, or from shift register 38 to the memory shift register 32A. The transistors Q2 and Q3 effect a shift in the voltage level to adapt the clock signal for the MNOS technology of which the memory 32 is constructed.

The read initializing circuit 131, as shown in FIGS. 4A and 4B, prepares the memory 32 to have the storage elements of each of the data rows W1, W2 and W3 prepared in order that the data stored thereon may be read out. During the initialize or read step of both the pulse increment and interrogation modes of operation, an initialize signal INIT is generated by the counter decoder 114 (as previously explained), and is applied to the NAND gate 130 of the read initializing circuit 131. At the time the initialize INIT signal is generated, a sequence clock signal SEQ CK also is generated to reset the binary counter 94 of FIG. 3, whereby after two clock pulses are received, signal CT2 is generated and is applied to the other input of the NAND gate 130, thereby terminating the application of the output signal from NAND gate 130 to the clock input CK of the shift register 116, whereby it is toggled to provide the read terminate signal INIT2 after the desired period of time, as explained above. Normally, a −8V is applied to the input terminal EQ of the memory 32 through resistor R37, whereby the voltage or charge stored upon each of the two MNOS transistors comprising a storage element of the memory 32, is equalized. During the initialize or read cycle, a signal is derived for a period of two counts from the Q1 output of the shift register 116 and is inverted by NAND gate 132, before being applied via resistor R34 to the base of transistor Q10, whereby transistor Q10 is turned on and a potential in the order of +12V to the EQ input terminal of the MNOS memory 32, which disables the equalizing action on the source terminal of the two MNOS transistors making up a memory element and the input gates of the sensing circuit that detects the state of the MNOS transistors. After the read cycle corresponding to two clock pulses, the signal INIT2 is generated and is applied via inverter 134 and resistor R36 to the base of transistor Q11 and therefrom to the base of transistor Q12, whereby a voltage in the order of −20V is applied to the boost terminal of the memory 32, whereby the sense amplifiers associated with each of the memory elements, i.e. two MNOS transistors of the memory 32, are enabled. As more fully described in "Advance Information, NC7030-128 Bit Serial Access Non-Voltable Register Stack", 3/75, NITRON, to provide a read voltage of the proper magnitude on the selected word line, e.g. W1, W2 or W3, through decoder 28, a voltage divider is formed by the selected pull-up resistor, either R25, R26 or R27 and R34. The read voltage is reset by the application of the read terminate signal INIT2 on transistor Q7 via resistor R29 and NAND gate 128 which resets the read voltage to the unaddressed voltage level of +12V.

Further, the coordination of the plus one circuit 34, serial adder 36 and shift register 38 is shown in more detail in FIG. 4B. In particular, the shift clock signal CKSH is inverted by inverter 122 to provide a signal $\overline{CKSH}$ that is applied to the clock input of the plus one circuit 34, taking the form of a flip-flop. Thus, as the inverted shift clock $\overline{CKSH}$ signal is applied, the plus one circuit 34 toggles, whereby a 1-bit signal is added to the serial adder 36. In the first or pulse increment mode of operation, the data is shifted serially out from the 16-bit shift register 32A and into the serial adder 36 under the control of an inverted clock signal $\overline{CKM}$ that is applied to its clock input. The incremented data is derived from the SUM 1 terminal of the serial adder 36 and is applied to an input terminal IN A of the shift register 38 under the control of the shift clock signal CKSH. In particular, the clock signal CKSH is applied to a first terminal of the AND gate 140 (see FIG. 4A), the AND gate 140 being enabled by the shift-out signal SHO to permit the entry of the shift clock signal to the CE input of the shift register 38, whereby sixteen pulses are applied from the shift register 38 to the input of the shift register 32A to permit the transfer of data from the memory shift register 32A to the selected row of the memory 32.

During the shift-in of data, the shift-in signal SHI is applied to a first terminal of the NAND gate 138 and the clock memory signal CKM is applied via inverter 136 and enable NAND gate 138, to the C input of memory 32, whereby the incremented data is shifted from the shift register 38 to the memory shift register 32A. When it is desired to read data out from the pulse accumulator and memory system 10, a pulse interrogate signal is developed, as described above, and applied to the NAND gate 151 so that upon the occurrence of the shift-out signal SHO, data is effectively shifted out from the memory shift register 32A via the enabled NAND gate 151 and NAND gate 150 (see FIG. 2A) to selectively turn on and off transistor Q21 whereby the light-emitting diode LED 1 is selectively energized to emit radiation, which is sensed by transistor Q20 to be recorded upon a suitable storage means of the portable interrogation unit 14.

In the detailed, illustrative embodiment provided by FIGS. 3A, 3B, 4A and 4B, integrated circuits (IC) are employed, specific, illustrative examples of which are listed below:

| Element No. | IC Designator No. |
| --- | --- |
| Binary Counter 94 | 14020 |
| Binary Counter 100 | MC 14510 |
| AND/OR INVERTER CIRCUIT 90, 108 | 4086 B |
| Counter Decoder 114 | 4022 |
| Row Select Decoder 28 | DG 508 MUX |
| 4 Bit Shift Register 116 | CD 4015 |
| Shift Register 38 | MC 14557 |
| Serial Adder 36 | CD 4032 |
| Plus One Circuit 34 | 4013 |

Numerous changes may be made in the abovedescribed apparatus and the different embodiments of the invention may be made without departing from the spirit thereof; therefore, it is intended that all matter contained in the foregoing description and in the accompanying drawings shall be interpreted as illustrative and not in a limiting sense. Though the invention has been described above with respect to one illustrative embodiment as a system for accumulating and storing pulse signals from a utility meter, it is contemplated that this invention has equal applicability to many other environments where it is desired to accumulate and store a series of signals indicative of the occurrence of an event and/or the utilization of a measured quantity of a substance or energy flow.

What is claimed is:

1. In a system without a local power supply for measuring and accumulating a manifestation of the consumption of a utility, comprising:
   (a) meter means responsive to the utility consumption for generating a series of pulse-like, electrical signals, each indicative of the consumption of a given quantity of the utility;
   (b) non-volatile memory means for storing an indication of the number of the pulse-like, electrical signals generated by said meter means, indicative of the total measured utility consumed;
   (c) power conversion means for converting at least one of the pulse-like, electrical signals to provide solely that voltage for energizing said system, including detector means responsive to the initiation of a pulse-like, electrical signal for providing an initiate operate signal; and
   (d) sequence control means responsive to the initiate operate signal for enabling the received pulse-like signal to be stored in said memory means, and thereafter providing a terminate operation signal effecting the deactuation of said system.

2. A measuring and accumulating system as claimed in claim 1, wherein there is further included incrementing means responsive to the occurrence of a pulse-like, electrical signal for incrementing the previous indication of the number of pulse-like, electrical signals stored in said memory means, and for storing the newly-incremented indication in said memory means.

3. The measuring and accumulating system as claimed in claim 2, wherein said incrementing means includes a serial adder circuit for receiving in serial fashion digital data indicative of the previously-stored indication of the number of pulse-like, electrical signals, and a plus one circuit for applying a signal to said serial adder circuit, whereby the previous indication of the number of pulse-like electrical signals is incremented by one.

4. The measuring and accumulating system as claimed in claim 2, wherein said sequence control means is responsive to the initiate operate signal for first reading out the previously-stored indication of the number of pulse-like, electrical signals stored in said memory means, secondly actuating said adding means to increment the read-out, previous indication of the number of pulse-like, electrical signals, and for re-storing in said memory means the incremented indication of the number of pulse-like, electrical signals.

5. The measuring and accumulating system as claimed in claim 4, wherein there is further included a serial shift register for receiving the incremented indication of the number of pulse-like, electrical signals as provided by said adding means.

6. The measuring and accumulating system as claimed in claim 1, wherein said memory means comprises a non-volatile, addressable memory comprising a plurality of MNOS elements capable of storing each bit of a data word providing the indication of the number of the pulse-like, electrical signals.

7. The measuring and accumulating system as claimed in claim 6, wherein said memory includes a shift register wherein the data word may be transferred between an addressed location within the memory means and said shift register.

8. In a system for measuring and accumulating as claimed in claim 1, and particularly adapted to be operated in conjunction with an external interrogation unit, said interrogation unit providing an interrogation request signal to said measruing and accumulating system, effecting the read-out from said memory means of the stored indication of the number of pulse-like, electrical signals and therefore the total measured utility consumed, and for applying same to said external interrogation unit.

9. The measuring and accumulating system as claimed in claim 8, wherein there is further included select means responsive to the application of a pulse-like, electrical signal from said meter means for operating said system in a first, pulse increment mode of operation wherein the previously -stored indication of the number of pulse-like, electrical signals is incremented, and in a second, interrogation mode of operation wherein the indication of the number of pulse-like, electrical signals as stored in said memory means is read out and applied to said external interrogation means.

10. The measuring and accumulating system as claimed in claim 9, wherein there is included a serial adder coupled to said memory means to receive data serially read out from said memory means indicative of the previously-stored indication of the number of pulse-like, electrical signals, an incrementing circuit and a shift register for receiving the incremented indication of the number of pulse-like, electrical signals, and said sequence control means is responsive in the first, pulse increment mode of operation to the initiate operate signal for shifting out the data from the memory means indicative of the previous indication of the number of pulse-like electrical signals, thereafter effecting the operation of the incrementing circuit and the serial adder to increment the previous indication of the number of pulse-like, electrical signals before storing the incremented indication in said shift register, thereafter shifting the incremented indication into said memory means, and thereafter generating the terminate operation signal effecting the deactuation of said system.

11. The measuring and accumulating system as claimed in claim 9, wherein said memory means includes a first addressed location for storing a first data word inciative of the number of pulse-like, electrical signals, and a second addressed location for receiving a second data word identifying the customer consuming the utility, and said sequencer means is responsive in the second, interrogation mode of operation to the initiate signal to successively read out from said memory means the first and second data words from the first and second addresses to be applied to said external interrogation unit.

12. The measuring and accumulating system as claimed in claim 9, wherein there is further included a master clock actuated in the first pulse increment mode of operation to provide a clock signal of a given frequency to said sequence control means to time the operations carried out in said first, pulse increment mode of operation.

13. The measuring and accumulating system as claimed in claim 12, wherein the external interrogation unit provides the interrogation request signal in the form of a train of clock pulses of said given frequency, said select means applying one of the output of said master clock or the interrogation request signal to said sequence control means dependent upon whether said system is operative in its first or second mode of operation.

14. The measuring and accumulating system as claimed in claim 13, wherein there is further included switch means for receiving the interrogation request clock signal and the master clock signal and responsive to the terminate operation signal for disconnecting same to said sequence control means.

15. The measuring and accumulating system as claimed in claim 13, wherein there is included address means for sequentially addressing said first and second address locations of said memory means, and said sequence control means in said second pulse interrogation mode, reads out the first data word from said first addressed location of said memory means, to be applied to said external interrogation unit, said address means being responsive to the completion of the first readout to address said second addressed location of said memory means, and thereafter said sequence control means effecting a readout of the second data word from said second addressed location of said memory means to be applied to said external interrogation unit.

16. The measuring and accumulating system as claimed in claim 15, wherein there is included a turn-off circuit, said address means responsive to the completion of reading from said second address location for providing a completeread manifestation, said turn-off circuit responsive to the read-complete manifestation for effecting a termination of the operation of said system.

17. In a system for measuring and accumulating as claimed in claim 8, wherein said external interrogation unit comprises a portable unit capable of being readily transported from one customer location to the next.

18. In a system for measuring and accumulating as claimed in claim 8, wherein said external interrogation unit comprises a centralized unit disposed remotely of said system and coupled by an electrical connector to said system for applying the interrogation request signal thereto.

19. A measuring and accumulating system as claimed in claim 1, wherein the pulse length of a pulse-like electrical signal as generated by said meter means is of a given length, and said sequence control means generates its terminate operation signal a period of time after the generation of the initiate operate signal, not in excess of said given length.

20. A system without a local power supply for measuring and accumulating a series of electrical signals, comprising:
 (a) means for providing the series of the electrical signals;
 (b) non-volatile memory means for successively storing the series of signals as each is received by said system;
 (c) power conversion means for converting at least one of the electrical signals to provide solely that voltage for energizing said system and including detector means responsive to the receipt of the electrical signal for providing an initiate operation signal; and
 (d) sequence control means responsive to the initiate operation signal for enabling the received electrical signal to be stored in said memory means and thereafter providing a terminate operation signal effecting the deactuation of said system.

21. A measuring and accumulating system as claimed in claim 20, wherein there is further included incrementing means responsive to the occurrence of a pulse-like, electrical signal for incrementing the previous indication of the number of pulse-like, electrical signals stored in said memory means, and for storing the newly-incremented indication in said memory means.

22. The measuring and accumulating system as claimed in claim 21, wherein said incrementing means includes a serial adder circuit for receiving in serial fashion digital data indicative of the previously-stored indication of the number of pulse-like, electrical signals, and a plus one circuit for applying a signal to said serial adder circuit, whereby the previous indication of the number of pulse-like, electrical signals is incremented by one.

23. The measuring and accumulating system as claimed in claim 22, wherein said sequence control means is responsive to the initiate operate signal for first reading out the previously-stored indication of the number of pulse-like, electrical signals stored in said memory means, secondly actuating said incrementing means to increment the read-out, previous indication of the number of pulse-like, electrical signals, and for re-storing in said memory means the incremented indication of the number of pulse-like, electrical signals.

24. The measuring and accumulating system as claimed in claim 20, wherein said memory means comprises a non-volatile, addressable memory comprising a plurality of MNOS elements capable of storing each bit of a data word providing the indication of the number of the pulse-like, electrical signals.

25. In a system for measuring and accumulating as claimed in claim 20, and particularly adapted to be operated in conjunction with an external interrogation unit, said interrogation unit providing an interrogation request signal to said measuring and accumulating system, effecting the readout from said memory means of the stored indication of the number of pulse-like, electrical signals and therefore the total measured utility consumed, and for applying same to said external interrogation unit.

26. The measuring and accumulating system as claimed in claim 25, wherein there is further included select means responsive to the application of a pulse-like, electrical signal from said meter means for operating said system in a first, pulse increment mode of operation wherein the previously-stored indication of the number of pulse-like, electrical signals is incremented, and in a second, interrogation mode of operation wherein the indication of the number of pulselike, electrical signals as stored in said memory means is read out and applied to said external interrogation unit.

27. The measuring and accumulating system as claimed in claim 26, wherein said memory means includes a first addressed location for storing a first data word indicative of the number of pulse-like, electrical signals, and a second addressed location for receiving a second data word identifying the customer consuming the utility, and said sequencer means is responsive in the second, interrogation mode of operation to the initiate signal to successively read out from said memory means the first and second data words from the first and second addresses to be applied to said external interrogation unit.

28. The measuring and accumulating system as claimed in claim 26, wherein there is further included a master clock actuated in the first, pulse increment mode of operation to provide a clock signal of a given frequency to said sequence control means to time the operations carried out in said first, pulse increment mode of operation.

29. The measuring and accumulating system as claimed in claim 28, wherein said external interrogation unit provides the interrogation request signal in the form of a train of clock pulses of said given frequency, said select means applying one of the output of said master clock or the interrogation request signal to said sequence control means dependent upon whether said system is operative in its first or second mode of operation.

30. In a system without local power supply for measuring the consumption of a utility by a customer and adapted to be interrogated by an external interrogation unit to read out a manifestation of the consumption of the utility consumed by the customer, comprising:
   (a) a utility meter responsive to the utility consumed by said customer, for generating a pulse-like, electrical signal upon the occurrence of the consumption of a given quantity of the utility;
   (b) coupling means for coupling said measuring and accumulating system to the external interrogation unit;
   (c) non-volatile memory means for storing in a first address location thereof a first data word indicative of the number of pulse-like, electrical signals generated by said utility meter, indicating the total measured utility consumed by the customer, and for storing at a second address location of said memory means a second data word indicative of a customer identification number;
   (d) power conversion means for converting either the pulse-like signals or an interrogation signal applied by the interrogation unit via said coupling means to said system, to provide solely that voltage for energizing said system;
   (e) detector means responsive to the receipt of either of the pulse-like signal or the interrogate request signal from the external interrogation unit for providing an initiate operation signal;
   (f) a select circuit responsive to the receipt of the pulse-like, electrical signal from said meter for operating said system in a first, pulse increment mode of operation and to the receipt of the interrogation signal from the external interrogation unit for operating said system in a second, pulse request mode of operation; and
   (g) sequence control means responsive to the initiate operate signal in the first, pulse increment mode of operation for, first, reading out from said memory means the first data word and thereafter incrementing the read-out first data word by "1" before re-storing the incremented first data word in said first address location of said memory means, and responsive to the initiate operate signal in said second mode of operation for successively reading out from said first addressed location the first data word and thereafter reading out the second data word from said second address location of said memory means, both of the first and second data words to be applied through said coupling means to the external interrogation unit.

31. A measuring system as claimed in claim 30, wherein there is further included incrementing means responsive to the occurrence of a pulse-like, electrical signal for incrementing the first data word stored in said memory means, and for storing the newly-incremented indication in the first address location of said memory means.

32. The measuring system as claimed in claim 31, wherein said incrementing means includes a serial adder circuit for receiving in serial fashion the first data word, and a plus one circuit for applying a signal to said serial adder circuit, whereby the first data word is incremented by one.

33. The measuring system as claimed in claim 31, wherein said memory means comprises a non-volatile, addressable memory comprising a plurality of MNOS elements capable of storing each bit of the first and second data words.

34. The measuring and accumulating system as claimed in claim 30, wherein there is further included a master clock actuated in the first pulse increment mode of operation to provide a clock signal of a given frequency to said sequence control means to time the operations carried out in said first, pulse increment mode of operation.

35. The measuring and accumulating system as claimed in claim 34, wherein the external interrogation unit provides the interrogation request signal in the form of a train of a clock pulse of said given frequency, said select means applying one of the output of said master clock or the interrogation request signal to said sequence control means dependent upon whether said system is operative in its first or second mode of operation.

36. The measuring and accumulating system as claimed in claim 35, wherein there is included address means for sequentially addressing said first and second address locations of said memory means, and said sequence control means in said second, pulse interrogation mode, reads out the first data word from said first addressed location of said memory means, to be applied to the external interrogation unit, said address means being responsive to the completion of the first readout to address the second addressed location of said memory means, and thereafter said sequence control means effecting a readout of the second data word from said second addressed location of said memory means to be applied to the external interrogation unit.

37. The measuring and accumulating system as claimed in claim 36, wherein there is included a turn-off circuit, said address means responsive to the completion of reading from said second address location for providing a completeread manifestation, said turn-off circuit responsive to the read-complete manifestation for effecting a termination of the operation of said system.

38. A system without local power supply for measuring and accumulating a series of electrical signals, comprising:
 (a) means for providing the series of the electrical signals;
 (b) non-volatile memory means for successively storing each of the series of signals;
 (c) power conversion means for converting one of the electrical signals to provide solely that voltage for energizing said system and responsive to the one electrical signal for producing an initiate operation signal; and
 (d) means responsive to the initiate operation signal for enabling the received electrical signal to be stored in said memory means.

39. The measuring and accumulating system as claimed in claim 38, wherein said storing means develops a terminate operation signal after the storing of the received electrical signal, thus effecting the deactuation of said system.

* * * * *

UNITED STATES PATENT AND TRADEMARK OFFICE
CERTIFICATE OF CORRECTION

PATENT NO. : 4,132,981

DATED : January 2, 1979

INVENTOR(S) : Raymond V. White

It is certified that error appears in the above-identified patent and that said Letters Patent are hereby corrected as shown below:

Column 20, line 23, "completeread" should read -- complete-read --

Column 24, line 9, "completeread" should read -- complete-read --

Signed and Sealed this

Thirtieth Day of October 1979

[SEAL]

Attest:

RUTH C. MASON
Attesting Officer

LUTRELLE F. PARKER
Acting Commissioner of Patents and Trademarks